United States Patent
Teramoto et al.

(10) Patent No.: US 11,495,452 B2
(45) Date of Patent: Nov. 8, 2022

(54) METHOD FOR PRODUCING SILICON NITRIDE FILM

(71) Applicants: TOHOKU UNIVERSITY, Miyagi (JP); NIPPON SHOKUBAI CO., LTD., Osaka (JP)

(72) Inventors: Akinobu Teramoto, Miyagi (JP); Yoshinobu Shiba, Miyagi (JP); Takashi Abe, Osaka (JP); Akira Nishimura, Osaka (JP)

(73) Assignees: TOHKU UNIVERSITY, Miyagi (JP); NIPPON SHOKUBAI CO., LTD., Osaka (JP)

( * ) Notice: Subject to any disclaimer, the term of this patent is extended or adjusted under 35 U.S.C. 154(b) by 18 days.

(21) Appl. No.: 16/807,717

(22) Filed: Mar. 3, 2020

(65) Prior Publication Data
US 2020/0335322 A1    Oct. 22, 2020

(30) Foreign Application Priority Data
Mar. 6, 2019 (JP) .............................. JP2019-040483

(51) Int. Cl.
    *H01L 21/02* (2006.01)
(52) U.S. Cl.
    CPC ...... *H01L 21/0217* (2013.01); *H01L 21/0231* (2013.01); *H01L 21/02211* (2013.01); *H01L 21/02277* (2013.01)
(58) Field of Classification Search
    None
    See application file for complete search history.

(56) References Cited

U.S. PATENT DOCUMENTS

| | | | | |
|---|---|---|---|---|
| 4,657,777 | A * | 4/1987 | Hirooka | C23C 16/505 136/258 |
| 2002/0058371 | A1 | 5/2002 | Ohuchi | |
| 2010/0107978 | A1* | 5/2010 | Todd | H01L 21/0262 118/712 |
| 2014/0051262 | A9* | 2/2014 | Lavoie | H01L 21/02277 438/776 |
| 2018/0237914 | A1 | 8/2018 | Ogawa et al. | |
| 2018/0286669 | A1* | 10/2018 | Mallick | H01L 21/02164 |
| 2020/0266068 | A1* | 8/2020 | Li | H01L 29/40 |

FOREIGN PATENT DOCUMENTS

| | | |
|---|---|---|
| JP | 61-96755 | 5/1986 |
| JP | 2002-151587 | 5/2002 |
| JP | 2010-232610 | 10/2010 |
| JP | 2011-210780 | 10/2011 |
| JP | 2018-137293 | 8/2018 |

* cited by examiner

*Primary Examiner* — Alexander G Ghyka
(74) *Attorney, Agent, or Firm* — Wenderoth, Lind & Ponack, L.L.P.

(57) ABSTRACT

A method for preparing a silicon nitride film with a high deposition rate and a reduced damage to the substrate and/or the underlying layer formed under the silicon nitride film. The method for preparing a silicon nitride film contains the steps of irradiating a nitride with an ultraviolet light, and contacting the nitride irradiated with the ultraviolet light and a hydrogenated cyclic silane represented by a general formula $Si_nH_{2n}$, wherein n is 5, 6, or 7.

20 Claims, 2 Drawing Sheets

METHOD FOR PRODUCING SILICON NITRIDE FILM

FIELD OF THE INVENTION

This application claims the benefit of priority based on Japanese Patent Application No. 2019-040483, filed on Mar. 6, 2019. The entire content of the specification of Japanese Patent Application No. 2019-040483, filed on Mar. 6, 2019, is incorporated into this application by reference.

At least one embodiment of the present disclosure relates to a method for preparing a silicon nitride film.

BACKGROUND OF THE INVENTION

In semiconductor devices, silicon oxide ($SiO_2$) film and silicon nitride (SiN) film have been conventionally used as insulating films. The silicon oxide film has problems that the film is generally porous, and when the thickness of the film becomes thinner, current flows through the insulating film due to the electron tunneling effect. Therefore, it is desirable that the insulating film (e.g., gate insulating film) for the semiconductor device have a large dielectric constant to prevent current from flowing.

On the other hand, the silicon nitride film is expected to be used for miniaturization of semiconductor devices and as gate insulators for transistors because the silicon nitride film has a high density, and a small internal electric field at voltage application due to a large dielectric constant.

Methods for preparing a conventional silicon nitride film include methods for forming CVD (chemical vaporization deposition) such as a thermal CVD method and a plasma CVD method (Patent Documents 1 to 5). In the thermal CVD method, a silicon compound such as $SiH_4$ (or $H_2SiCl_2$) reacts with a nitride such as $NH_3$ under a deposition temperature of about 700 to 900° C. In the plasma CVD method, a silicon compound such as $SiH_4$ (or $H_2SiCl_2$) reacts with a nitride such as $NH_3$ or $N_2$ under a deposition temperature of about 350 to 500° C. while being excited by plasma.

PRIOR ART DOCUMENTS

Patent Documents

Patent Document 1: Japanese unexamined patent application publication No. 2011-210780
Patent Document 2: Japanese unexamined patent application publication No. 2010-232610
Patent Document 3: Japanese unexamined patent application publication No. 2018-137293
Patent Document 4: Japanese unexamined patent application publication No. S61-96755
Patent Document 5: Japanese unexamined patent application publication No. 2002-151587

SUMMARY OF THE INVENTION

Problems to be Solved by the Invention

On the other hand, with the diversification of insulating layers such as underlying layers in recent semiconductor devices, it is desirable to lower the temperature for forming the silicon nitride film in order to reduce damage to the substrate and/or the underlying layer.

However, since the thermal CVD method requires high temperature conditions (about 700 to 900° C.) during film formation, the substrate and/or the underlying layer may be damaged by the heat.

In addition, although the plasma CVD method can adopt a lower temperature during film formation compared to that of the thermal CVD method, the damage to the substrate and/or the underlying layer may be greater due to high energy plasma.

Thus, the conventional methods for preparing the silicon nitride film could not sufficiently reduce the damage to the substrate and/or the underlying layer. Under such circumstances, it is necessary to increase the deposition speed of the silicon nitride film in order to fabricate semiconductor devices in larger quantities and efficiently, and it is also necessary to make the obtained silicon nitride film uniform in physical properties such as refractive index and N/Si ratio.

Accordingly, at least one embodiment of the present disclosure provides a method for preparing a silicon nitride film with a high deposition rate and a reduced damage to the substrate and/or the underlying layer formed under the silicon nitride film. In addition, at least one embodiment of the present disclosure provides a method for preparing a silicon nitride film with uniform physical properties such as refractive index and N/Si ratio.

Solutions to the Problems

As a result of examination of the above problem, the present inventors have found that a silicon nitride film can be successfully prepared by contacting a nitride excited by an ultraviolet light and a predetermined cyclic hydrogenated silane on a substrate at a predetermined temperature instead of the conventional thermal CVD method and plasma CVD method, to complete at least one embodiment of the present disclosure.

That is, at least one embodiment of the present disclosure relates to a method for preparing a silicon nitride film containing steps of irradiating a nitride with an ultraviolet light, and contacting the nitride irradiated with the ultraviolet light and a cyclic hydrogenated silane represented by a general formula $Si_nH_{2n}$, wherein n is 5, 6, or 7.

Effects of the Invention

According to at least one embodiment of the present disclosure, the deposition temperature of the silicon nitride film can be lowered without the use of plasma, and the damage to the substrate and/or the underlying layer formed under the silicon nitride film can be reduced.

Moreover, according to at least one embodiment of the present disclosure, when comparing with conventional raw materials such as $SiH_4$, $Si_2H_6$, $H_2SiCl_2$, and the like, a cyclic hydrogenated silane having 5 or more of silicon atoms in a single molecule is more reactive than a linear hydrogenated silane because it is derived from the cyclic structure consisting of Si atoms and can efficiently deposit a silicon nitride film by contacting with a nitride irradiated with an ultraviolet light, so that an amount of the silane raw material is decreased and the rate for forming the silicon nitride film is improved, and the time to form the silicon nitride film also can be reduced. In addition, when the cyclic hydrogenated silane is used as a raw material, the film can be deposited at a high deposition rate even if the deposition temperature is lowered, and the silicon nitride film with almost uniform refractive index and N/Si ratio can be obtained.

Furthermore, according to at least one embodiment of the present disclosure, the cyclic hydrogenated silane has a network of higher-order cyclic structures in which Si atoms are bonded to each other, and the silicon nitride film is prepared in high denser than that of the conventional raw materials such as $SiH_4$ and $Si_2H_6$, so that the characteristics of the silicon nitride film can be expected to be improved. In addition, it is expected to improve the coverage of the silicon nitride film due to the higher-order structure.

MODE FOR CARRYING OUT THE INVENTION

A method for preparing a silicon nitride film of at least one embodiment of the present disclosure (hereinafter referred to as the preparation method of the present disclosure) contains steps of irradiating a nitride with an ultraviolet light, and contacting the nitride irradiated with the ultraviolet light and a cyclic hydrogenated silane represented by a general formula $Si_nH_{2n}$, wherein n is 5, 6, or 7, (hereinafter referred to as (v) contact step of cyclic hydrogenated silane and nitride).

This step is preferably performed by contacting the nitride irradiated with the ultraviolet light and the cyclic hydrogenated silane represented by the general formula $Si_nH_{2n}$ on a substrate at 500° C. or lower in a non-plasma reactor.

The preparation method of at least one embodiment of the present disclosure differs from the conventional thermal CVD method in that the heating temperature of the substrate is lower than that of the conventional thermal CVD method, and the conventional plasma CVD method in that there is no need to use plasma, so that the damage to the substrate and/or the underlying layer formed under the silicon nitride film can be reduced without using plasma having high thermal history and high energy.

In addition, in the case where the cyclic hydrogenated silane is used instead of the linear hydrogenated silane and the number of silicon atoms of the cyclic hydrogenated silane is 5 or more, the reactivity with the nitride irradiated by the ultraviolet light becomes higher, and thus the rate for forming the silicon nitride film becomes better and the silicon nitride film with uniform characteristics can be produced.

The preparation method of at least one embodiment of the present disclosure may include, in addition to (v) the above-mentioned step (contact step of cyclic hydrogenated silane and nitride), (i) preparation step of cyclic hydrogenated silane, (ii) supply step of cyclic hydrogenated silane, (iii) dilution step of cyclic hydrogenated silane, (iv) supply step of nitride, (vi) reheating step of silicon nitride film, and the like. Each step is described below in the order of (i) to (vi).

<(i) Preparation Step of Cyclic Hydrogenated Silane>

The preparation step of the cyclic hydrogenated silane is not particularly limited as long as it is a conventionally known method.

In the present invention, the cyclic hydrogenated silane is represented by the general formula $Si_nH_{2n}$, wherein n is 5, 6, or 7.

Specifically, the cyclic hydrogenated silane is preferably a cyclic hydrogenated silane having no branched silyl group, such as cyclopentasilane, cyclohexasilane, or cycloheptasilane, or a cyclic hydrogenated silane having a branched silyl group, such as silyl cyclotetrasilane, silyl cyclopentasilane, or silyl cyclohexasilane. It is more preferable that the cyclic hydrogenated silane is a cyclic hydrogenated silane having no branched silyl group.

In the present invention, the cyclic hydrogenated silane may be partly functionalized cyclic silane as represented by a general formula $Si_nH_{(2n-a)}R_a$, wherein n is 5, 6, or 7, a is 1 to 2n, R is an alkyl group, an aryl group, $NR'_2$, F, Cl, Br, I, R' is H, an alkyl group, or an aryl group.

a is from 1 to 2n, preferably from 1 to 7, more preferably from 1 to 4, and even preferably from 1 to 2.

The alkyl group includes a straight-chain alkyl group such as a methyl group, an ethyl group, a propyl group, a butyl group, a pentyl group, a hexyl group, a heptyl group, an octyl group, a nonyl group, and the like; a branched-chain alkyl group such as an isopropyl group, an isobutyl group, a sec-butyl group, a tert-butyl group, a neopentyl group, a (2-ethyl)hexyl group, and the like; an alkenyl group such as a vinyl group, a 1-propenyl group, a 2-propenyl (allyl) group, and the like; a cycloalkyl group such as a cyclopropyl group, a cyclobutyl group, a cyclopentyl group, a cyclohexyl group, a cycloheptyl group, a cyclooctyl group, and the like; a cycloalkenyl group such as a cyclohexenyl group, a cycloheptenyl group, a cyclooctenyl group, and the like. The number of carbons of the alkyl group is preferably 1 to 10, more preferably 1 to 8, even preferably 1 to 5, and even more preferably 1 to 3.

The aryl group includes an aromatic hydrocarbon group such as a phenyl group, an o-tolyl group, a m-tolyl group, a p-tolyl group, a mesityl group, a 1-naphthyl group, a 2-naphthyl group, a phenanthryl group, an anthryl group; and the like. The number of carbons of the aryl group is preferably 6 to 20, more preferably 6 to 16, even preferably 6 to 12, and even more preferably 6 to 10.

When each of R and R' is present in two or more kinds, R and R' may be the same or different.

In the preparation method of at least one embodiment of the present disclosure, when the linear hydrogenated silane (e.g., disilane) different from the cyclic hydrogenated silane is used, it is difficult to form a silicon nitride film in the case where the heating temperature of the substrate is low, and the rate for forming the silicon nitride film tends to become slower even if the film can be formed by raising the heating temperature of the substrate.

The cyclic hydrogenated silane preferably contains at least cyclohexasilane, and preferably contains cyclohexasilane as the main component of the cyclic hydrogenated silane (a content of cyclohexasilane is 80% by mass or more per 100% by mass of the cyclic hydrogenated silane).

The content of cyclohexasilane is preferably 80% by mass or more, more preferably 90% by mass or more, even preferably 95% by mass or more, and even more preferably 97% by mass or more per 100% by mass of the cyclic hydrogenated silane, and preferably almost 100% by mass, but may be 99.9% by mass or less or 99.7% by mass or less.

The content of the cyclic hydrogenated silane can be expressed based on mass and can be determined based on gas chromatograms obtained in the following gas chromatography conditions:

Gas chromatography conditions
Detection: FID
Column: Agilent J&W GC column DB-5 ms Phenyl-Arylene polymer, 0.25 μm×
0.25 nm×30 m
Temperature of vaporization chamber: 250° C.

Temperature of detector: 280° C.
Temperature elevating conditions: 1) at 50° C. for 5 minutes, 2) elevation of temperature up to 250° C. at a temperature elevating rate of 20° C./minute, 3) elevation of temperature up to 280° C. at a temperature elevating rate of 10° C./minute, and 4) at 280° C. for 10 minutes The area of the gas chromatograms means a total area of gas chromatograms of the cyclic hydrogenated silane obtained in gas chromatography conditions. Contents of each of the cyclic hydrogenated silanes and each of the linear hydrogenated silanes may be determined from the area of the gas chromatograms.

In at least one embodiment of the present disclosure, the cyclic hydrogenated silane may be appropriately purified as necessary, or may be purified by distillation.

When the cyclic hydrogenated silane is cyclohexasilane, the cyclohexasilane may be prepared by a known method.

For example, (1) cyclohexasilane is obtained by coupling diphenyl dichlorosilane with a metal to form a six-membered ring and then going through a halogenation step and a reduction step, (2) cyclohexasilane is obtained by reacting trichlorosilane as halosilane, triphenylphosphine, N,N-diisopropyl ethylamine to form a cyclic halosilane neutral complex in which triphenylphosphine is coordinated with dodecachlorocyclohexasilane of the six-membered ring, and then reducing this cyclic halosilane neutral complex, or (3) cyclohexasilane is obtained by reacting trichlorosilane as halosilane, onium salts such as ammonium salts or phosphonium salts, and tertiary amines, treating the salt of the cyclic halosilane compound with a Lewis acid compound and then reducing the cyclic halosilane compound. Furthermore, cyclohexasilane may be purified in order to remove impurities in the viewpoint of forming a silicon film at high purity.

<(ii) Supply Step of Cyclic Hydrogenated Silane>

The supply step of the cyclic hydrogenated silane is not particularly limited as long as the cyclic hydrogenated silane which is filled in a tank for filling the cyclic hydrogenated silane is supplied (transferred) to a non-plasma reactor (chamber) in a gaseous state. It is preferable that the cyclic hydrogenated silane is supplied to the non-plasma reactor (chamber) after the cyclic hydrogenated silane is vaporized by bubbling an inert gas, vaporized with baking, and the like, and it is more preferable that the cyclic hydrogenated silane is supplied to the non-plasma reactor after the cyclic hydrogenated silane is vaporized by bubbling an inert gas.

Specifically, since the cyclic hydrogenated silane is liquid at room temperature, it is preferable to supply an inert gas such as argon gas to the tank for filling the cyclic hydrogenated silane to vaporize the cyclic hydrogenated silane by bubbling the inert gas, baking and the like, and then to supply (transfer) the vaporized cyclic hydrogenated silane in a line (e.g., pipe) for supplying the cyclic hydrogenated silane leading from the tank for filling the cyclic hydrogenated silane to the non-plasma reactor.

The line for supplying the cyclic hydrogenated silane can be made of any material known to the public in the conventional technology as long as the cyclic hydrogenated silane is transferred in a vaporized state, and can be made of corrosion-resistant aluminum, stainless steel, and the like. In addition, the structure of the line for supplying the cyclic hydrogenated silane is not particularly limited, as long as it is an enclosed pipe for transferring a gaseous material from the tank for filling the cyclic hydrogenated silane to the non-plasma reactor.

The tank for filling the cyclic hydrogenated silane is provided with a line for introducing an inert gas, and it is preferable to open a valve attached to this line, to supply the inert gas to the tank for filling the cyclic hydrogenated silane, and to transfer the vaporized cyclic hydrogenated silane from inside the tank.

The material of the tank for filling the cyclic hydrogenated silane is not particularly limited as long as the cyclic hydrogenated silane does not thermal-polymerize or photopolymerize, and the material thereof includes a high-strength, light-impermeable stable material such as nickel, molybdenum, manganese, chromium, titanium, copper, aluminum, stainless steel, and their alloys.

Specifically, the material of the tank for filling the cyclic hydrogenated silane is preferably stainless steel (SUS). The tank for filling the cyclic hydrogenated silane may be light-shielding, or a light-shielding plate may be used as necessary. Furthermore, it is preferable that the tank for filling the cyclic hydrogenated silane has a pressure resistance. It is more preferable that the material of the tank for filling the cyclic hydrogenated silane has a pressure resistance of 0.05 MPa or more.

The tank for filling the cyclic hydrogenated silane is required to have, for example, an outlet with one or two or more valves for attaching a supply line. At least one valve is preferably a valve for pressurization or a valve for filling a material and at least one valve is preferably a valve for transferring a gaseous material. In addition, the tank for filling the cyclic hydrogenated silane may have plural outlets for filling liquids, cleaning tanks, and the like.

The tank for filling the cyclic hydrogenated silane has a capacity of preferably about 50 mL to 100 L, and more preferably about 500 mL to 10 L. The shape of the tank for filling the cyclic hydrogenated silane is not particularly limited, and may be cylindrical, angular, tubular, and the like.

In the tank for filling the cyclic hydrogenated silane, the temperature of the cyclic hydrogenated silane in the aforementioned tank may be maintained below a predetermined temperature to the extent that the cyclic hydrogenated silane does not undergo thermalpolymerization or photopolymerization. The temperature of the cyclic hydrogenated silane is maintained at preferably 80° C. or lower, more preferably 60° C. or lower, and even preferably 40° C. or lower. The lower limit of the temperature of the cyclic hydrogenated silane is maintained at preferably 15° C. or higher, more preferably at 18° C. or higher, and even preferably at 20° C. or higher.

The tank for filling the cyclic hydrogenated silane has a pressure of, for example, 1 to 100 kPa, preferably 2 to 80 kPa, and more preferably 3 to 50 kPa. In this pressure range, the cyclic hydrogenated silane can be supplied from the tank to a line for supplying the cyclic hydrogenated silane in a gaseous state. The pressure may be adjusted by a pressure controller and the like on the line for supplying the cyclic hydrogenated silane.

The inert gas to supply the cyclic hydrogenated silane in the vaporization from bubbling and the like includes helium, neon, argon and the like, and the inert gas is preferably helium or argon, and more preferably argon in the viewpoint of versatility and cost.

Preferably, the inert gas is accommodated in a cylinder for filling the inert gas and supplied via a line for supplying the inert gas connected to the tank for filling the cyclic hydrogenated silane from the cylinder.

The flow rate of the inert gas introduced into the tank for filling the cyclic hydrogenated silane is, for example, from 0.1 to 100 sccm, preferably from 0.5 to 80 scan, and more preferably from 1 to 50 sccm.

<(iii) Dilution Step of Cyclic Hydrogenated Silane>

When the cyclic hydrogenated silane vaporized by bubbling or baking is supplied from the tank for filling the cyclic hydrogenated silane to the non-plasma reactor (chamber), it is preferable that the cyclic hydrogenated silane is diluted with a medium for diluting the cyclic hydrogenated silane after the cyclic hydrogenated silane is transferred from the tank for filling the cyclic hydrogenated silane.

The medium for diluting the cyclic hydrogenated silane may be supplied to a line (pipe) for supplying the cyclic hydrogenated silane connecting the tank for filling the cyclic hydrogenated silane and the non-plasma reactor (chamber). The medium for diluting the cyclic hydrogenated silane is preferably supplied via a line for supplying the media for diluting the cyclic hydrogenated silane connecting the cylinder for filling the media for diluting the cyclic hydrogenated silane and the line for supplying the cyclic hydrogenated silane.

The media for diluting the cyclic hydrogenated silane may be the same as the above-mentioned inert gas, and it is preferable to be argon.

The flow rate of the medium for diluting the cyclic hydrogenated silane (cyclic hydrogenated silane gas) is, for example, 1 to 1000 scan, preferably 1 to 800 sccm, more preferably 1 to 500 sccm, and even preferably 2 to 300 sccm.

The lines for supplying the cyclic hydrogenated silane, the inert gas, and the medium for diluting the cyclic hydrogenated silane may be interposed with a gas flow controller (preferably a flow control system (FCS)) to control the amount of the cyclic hydrogenated silane, the inert gas, and the medium for diluting the cyclic hydrogenated silane.

The gas flow controller can be a conventional mass flow controller, for example, the gas flow controller may be those that measures the gas mass flow rate and performs flow control. Such a controller can measure and control the flow rate with high accuracy without needing to make corrections even if the operating conditions change. Preferably, the gas flow controller comprises a flow sensor, a bypass, a flow control valve, an electrical circuit, and the like. The delivered gas is first divided into the flow sensor and the bypass, and the flow control valve may be electrically controlled so as to achieve an appropriate flow rate.

The gas flow controller may be in any location so long as it can control the flow rate of the cyclic hydrogenated silane, the inert gas, and the medium for diluting the cyclic hydrogenated silane.

<(iv) Supply Step of Nitride>

The supply step of the nitride may be any step in which the nitride as a gas is irradiated with the ultraviolet light and the excited (radicalized) nitride is supplied to the non-plasma reactor (chamber).

Preferably, the nitride is transferred via a line for supplying the nitride from a cylinder for filling the nitride to an inlet for introducing the nitride (the nitride gas) and the non-plasma reactor.

The nitride may be a gas and excited by the ultraviolet light, and is preferably ammonia. The nitride may be diluted with an inert gas such as argon. In addition, the nitride may contain very small amounts of $O_2$, $H_2$, $H_2O$, and the like, and these may be excited by the ultraviolet light together with the nitride.

Preferably, the ultraviolet light is irradiated from an ultraviolet light generator installed on the line for supplying the nitride connecting the cylinder for filling the nitride, the inlet for introducing the nitride, and the non-plasma reactor (chamber).

The ultraviolet light preferably has a wavelength of 100 to 250 nm, more preferably 140 to 250 nm, and even preferably 150 to 220 nm. Preferably, the ultraviolet light contains vacuum ultraviolet light.

The ultraviolet light has the above wavelength range and has a central wavelength of preferably 140 to 200 nm, more preferably 150 to 190 nm, and even preferably 160 to 180 nm.

The ultraviolet light is irradiated from, for example, an excimer lamp, preferably a xenon excimer lamp or an argon excimer lamp, and more preferably a xenon excimer lamp.

The irradiation energy of the ultraviolet light is, for example, 1 to 1000 $W/m^2$, and preferably 20 to 500 $W/m^2$.

A spectrometer may be installed in the ultraviolet light generator to confirm whether the nitrides are excited. In the preparation method of the present invention, the silicon nitride film cannot be deposited if the nitride is supplied directly into the non-plasma reactor (chamber) without irradiating the nitride with ultraviolet light.

The flow rate of the nitride to be supplied to the line for supplying the nitride (nitride gas) and the non-plasma reactor from the cylinder for filling the nitride is, for example, 100 to 2000 sccm, preferably 200 to 1500 sccm, and more preferably 300 to 1200 scam.

<(v) Contact Step of Cyclic Hydrogenated Silane and Nitride>

It is preferable that the cyclic hydrogenated silane is contacted with the nitride on a substrate in a non-plasma reactor (chamber).

The non-plasma reactor is preferably a reactor (chamber) that does not require the high-frequency power supply required for plasma.

The silicon nitride film may also be deposited by alternately supplying the cyclic hydrogenated silane and the nitride excited by the ultraviolet light, for example, by the atomic layer deposition method (ALD method).

Preferably, the non-plasma reactor is provided with, for example, an inlet for introducing the cyclic hydrogenated silane connected to the line for supplying the cyclic hydrogenated silane, an inlet for introducing the nitride connected to the line for supplying the nitride, a substrate (wafer), a substrate stage, a substrate heating heater, a pressure control device, a substrate transfer device, abs the like.

The non-plasma reactor (chamber) may be operated by reducing the pressure inside the reactor (chamber) with a vacuum pump or the like, and a combination of pumps such as a mechanical booster pump (MBP) and a turbomolecular pump (TMP) may be used.

The substrate may be composed of Si, $SiO_2$, SiC, and the like, although the substrate is not particularly limited as long as it is capable of forming a silicon nitride film.

An underlying layer may be formed on the substrate. It is preferable that the underlying layer composed of a GaN layer, an AlGaN layer, an AlN layer, and the like. It is also preferable that these layers are alternately multi-layered in the underlying layer.

The underlying layer may have a various shape such as a recess for gate formation.

In the non-plasma reactor (chamber), the substrate is preferably heated to 500 ® C. or lower.

The substrate temperature (substrate surface temperature) is more preferably 80° C. to 500° C., even preferably 90° C. to 450° C., even more preferably 100° C. to 400° C., and particularly preferably 100° C. to 350° C. When the substrate temperature (substrate surface temperature) is higher than 500° C., the underlying layer and the like is damaged by heat and the performance of the semiconductor device may be deteriorated in some cases. On the other hand, when the substrate temperature (substrate surface temperature) is lower than 80° C., the quality of the silicon nitride film and the film deposition speed may become insufficient.

In such a temperature range, the silicon nitride film can be deposited at lower temperatures than those of conventional thermal CVD method.

Preferably, the inlet for introducing the cyclic hydrogenated silane and the inlet for introducing the nitride are located in the non-plasma reactor such that the cyclic hydrogenated silane and the nitride can contact on the substrate to form a silicon nitride film. In the non-plasma reactor, the inlet for introducing the cyclic hydrogenated silane and the inlet for introducing the nitride may be formed in one or two or more inlets, respectively. In addition, the shapes of the inlet for introducing the cyclic hydrogenated silane and the inlet for introducing the nitride are not particularly limited as long as the gas thereof can be supplied to the substrate.

The inlet for introducing the cyclic hydrogenated silane may be provided with a nozzle extending close to the substrate, for example, and may further be provided with means (e.g., a heater) for heating the nozzle.

The nozzle may or may not be heated, but when the nozzle is heated, the heating temperature of the nozzle is, for example, 60° C. to 500° C., preferably 80° C. to 450° C., and more preferably 100° C. to 400° C.

The pressure of the non-plasma reactor (chamber) is, for example, 10 to 1000 Pa, and preferably 50 to 500 Pa.

The ratio of the flow rate of the cyclic hydrogenated silane to the flow rate of the nitride (cyclic hydrogenated silane/nitride) when flowing into the non-plasma reactor is preferably 0.001/1000 to 1000/1000, more preferably 0.05/1000 to 100/1000, and even preferably 0.08/1000 to 10/1000.

In such a range, the N/Si atomic number ratio can be easily controlled and a better silicon nitride film can be formed.

<(vi) Reheating Step of Silicon Nitride Film>

After the contact of the cyclic hydrogenated silane with the nitride, the silicon nitride film may be subjected to the reheating step from the viewpoint of increasing the density and the like of the silicon nitride film. The reheating step may be carried out in the non-plasma reactor or outside the non-plasma reactor.

The temperature of the reheating is, for example, 300° C. to 500° C., and preferably 400° C. to 500° C.

<Silicon Nitride Film>

At least one embodiment of the present disclosure also encompasses a silicon nitride film formed by a method for preparing the silicon nitride film. Since the silicon nitride film formed by the method of preparing the silicon nitride film can be formed at high speed and at low temperature, and the N/Si atomic number ratio can be controlled, so that the silicon nitride film can be appropriately used for semiconductors and electronic devices, such as thin film transistors and integrated circuits, in various sites to be required.

The silicon nitride film has a stoichiometric N/Si ratio of 1.33. The silicon nitride film of at least one embodiment of the present disclosure may have a desired film thickness, refractive index, and the like, and the thickness and the refractive index can be obtained by a spectro-ellipsometer (for example, spectro-ellipsometry UVISEL Horiba Corporation), and the like.

The thickness of the silicon nitride film is, for example, 1 to 1000 nm, preferably 2 to 500 nm, and more preferably 5 to 300 nm.

The refractive index of the silicon nitride film with a N/Si ratio close to 1.33 is about 2, and the silicon nitride film of the present disclosure preferably has a refractive index of about 2.

The silicon nitride film can also be etched as necessary. Although the method for etching of the silicon nitride film is not particularly limited, for example, dilute hydrofluoric acid solution (DHF) or phosphoric acid can be used.

In at least one embodiment of the present disclosure, the silicon nitride film obtained by the method for preparing the silicon nitride film is suitably used as a gate insulating film, a final protective film, an anti-reflection film and the like, for a semiconductor device.

Hereinafter, with reference to FIG. 1, a method for preparing the silicon nitride film of at least one embodiment of the present disclosure will be described in detail, but at least one embodiment of the present disclosure is not limited to this one embodiment.

Figure 1:
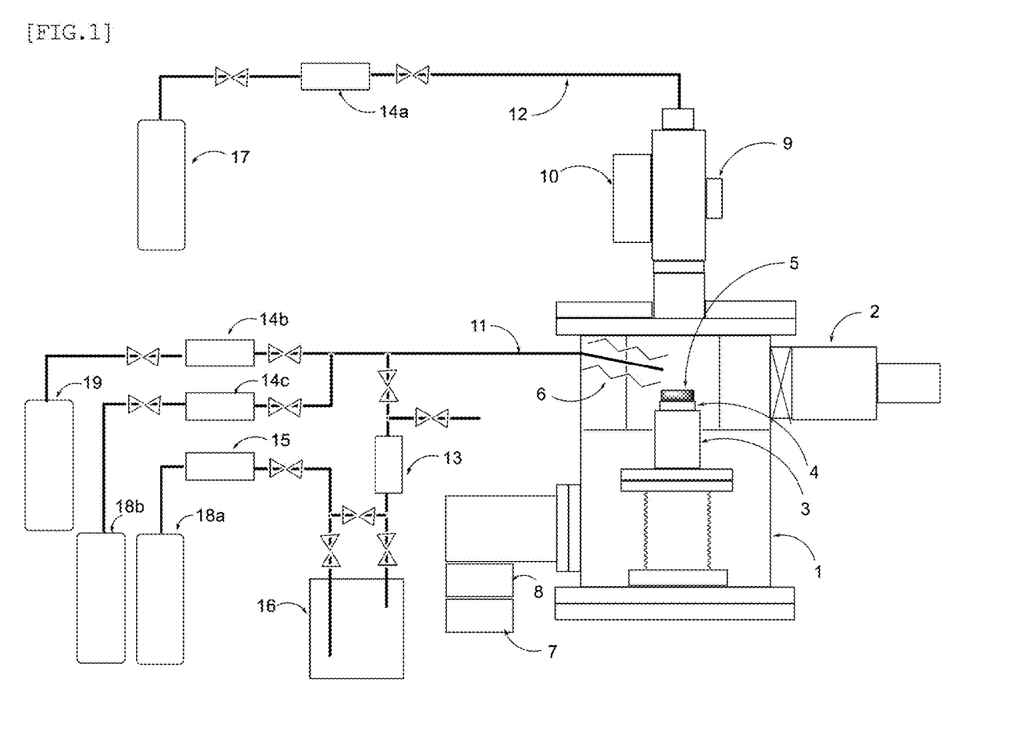
FIG. 1 shows one embodiment of an apparatus used in a method for preparing a silicon nitride film in at least one embodiment of the present disclosure.

FIG. 1 is a schematic diagram of an apparatus used in a method for preparing a silicon nitride film of at least one embodiment of the present disclosure, and the apparatus comprises at least a line 11 for supplying cyclic hydrogenated silane, a line 12 for supplying nitride, and a non-plasma reactor (chamber) 1 connected therewith.

In the non-plasma reactor 1, the cyclic hydrogenated silane is supplied from the line 11 for supplying the cyclic hydrogenated silane, the nitride is supplied from the line 12 for supplying the nitride, and the cyclic hydrogenated silane and the nitride are introduced in predetermined amounts, respectively.

Next, on a substrate (wafer) 5 heated to a predetermined temperature in the non-plasma reactor 1, the nitride irradiated with the ultraviolet light by an ultraviolet light generator 10 is contacted with the predetermined cyclic hydrogenated silane.

The chamber 1, which is the non-plasma reactor, contains at least a substrate (wafer) loading/unloading chamber 2, a substrate (wafer) 5, a stage 3 on which the wafer 5 is placed, a substrate (wafer) heater 4 placed between the wafer 5 and the stage 3, a heater 6 of the cyclic hydrogenated silane supply nozzle, a turbo molecular pump 7, an automatic pressure controller 8, an inlet for introducing the cyclic hydrogenated silane (not shown), and an inlet for introducing the nitride (not shown).

The substrate (wafer) loading/unloading chamber 2 is provided for moving a wafer prior to forming a silicon nitride film and a wafer on which a silicon nitride film is formed.

The stage 3 on which the substrate (wafer) 5 is placed can be moved vertically and horizontally, and the position of the wafer 5 can be adjusted according to the positions of the inlet for introducing the cyclic hydrogenated silane and the inlet for introducing the nitride, the supply speed of the cyclic hydrogenated silane and the nitride, and supply amounts thereof.

It is preferable that the substrate (wafer) heater 4 is set at a heating temperature as described above.

Preferably, the substrate (wafer) 5 is a material as described above.

The heater 6 for the cyclic hydrogenated silane supply nozzle is connected to the inlet for introducing the cyclic hydrogenated silane in the chamber 1, although not necessarily necessary, and the heater 6 itself may be tubular, and the heater 6 of a desired shape may be provided in the pipe for supplying the cyclic hydrogenated silane.

A turbo molecular pump 7 and an automatic pressure controller 8 are provided for discharging components that do not contribute to the deposition of the silicon nitride film in the chamber 1 to the outside of the chamber 1.

The chamber 1 is connected to the line 11 for supplying the cyclic hydrogenated silane and the line 12 for supplying the nitride.

The line 11 for supplying the cyclic hydrogenated silane transfers from a tank 16 for filling the cyclic hydrogenated silane the cyclic hydrogenated silane vaporized by bubbling the inert gas, baking, and the like.

It is preferable that the tank 16 for filling the cyclic hydrogenated silane has light shielding and pressure resistance.

The inert gas required for the delivery of the cyclic hydrogenated silane is introduced via a line connecting a cylinder 18a for filling the inert gas and the tank 16 for filling the cyclic hydrogenated silane. A mass flow meter (MFC) 15 is installed on the line to monitor the flow rate of the inert gas.

An automatic pressure controller 13 is provided between the line 11 for supplying the cyclic hydrogenated silane and the tank 16 for filling the cyclic hydrogenated silane to adjust the pressure of the tank 16 for filling the cyclic hydrogenated silane. The cyclic hydrogenated silane is diluted with an inert gas as a medium for diluting the cyclic hydrogenated silane, and this inert gas is supplied from the cylinder 18b for filling the inert gas to the line 11 for supplying the cyclic hydrogenated silane via the line for supplying the medium for diluting the cyclic hydrogenated silane.

As a control for the cyclic hydrogenated silane, disilane and the like can be used as the linear hydrogenated silane.

For example, disilane is supplied from a cylinder 19 for filling disilane ($Si_2H_6$) to the line 11 for supplying the cyclic hydrogenated silane (cyclic hydrogenated silane gas) via the line for supplying disilane.

A line 12 for supplying the nitride transfers the nitride from a cylinder 17 for filling the nitride.

The line 12 for supplying the nitride is provided with an ultraviolet light generator 10 between the cylinder 17 for filling the nitride, the inlet for introducing the nitride, and the non-plasma reactor 1. The nitride is excited by the ultraviolet light generated from the ultraviolet light generator 10, and a spectrometer 9 is provided in the ultraviolet light generator 10 to monitor the wavelength range and the center wavelength of the ultraviolet light.

Gas flow rate controllers (FCS) 14a, 14b, 14c are provided in the line 12 for supplying the nitride, the line for supplying the linear hydrogenated silane, and the line for supplying the medium for diluting the cyclic hydrogenated silane to adjust the supply rates.

In the apparatus shown in FIG. 1, each of conditions may be as described above.

EXAMPLES

The present disclosure will be more specifically described below with reference to Examples, but the present disclosure is not limited to the following Examples, and can be implemented with appropriate modifications within the scope conforming to the purport of what is mentioned above and below herein. All of such modifications are included in the technical scope of the present disclosure.

Example 1

A device for forming a silicon nitride film as described in FIG. 1 was used, and the silicon nitride film was prepared as follows.

1. Preparation Before the Formation of Silicon Nitride Film

A silicon oxide film wafer (Φ33 mm, thickness 500 nm) was prepared as a substrate, and a substrate (wafer) 5 was placed on the stage 3 in the chamber 1 through the substrate loading/unloading chamber 2, and the wafer 5 was fixed at a position of 40 mm from the tip of the cyclic hydrogenated silane supply nozzle. Next, the chamber 1 was controlled to a pressure of 400 Pa, and the substrate (wafer) heater 4 was used to heat the substrate temperature (wafer surface temperature) to 350° C. for 30 minutes.

2. Silicon Nitride Film Formation

The tank 16 for filling the cyclic hydrogenated silane in which cyclohexasilane (hereafter referred to as CHS, GC purity (AREA-%) 99%, 10 g) was filled as cyclic hydrogenated silane was controlled at 5 kPa using an automatic pressure controller 13. Next, inert gas (argon gas) (hereinafter referred to as CHS—Ar) was introduced into the tank 16 for filling the cyclic hydrogenated silane from the cylinder 18a for filling the inert gas (argon gas) at a flow rate of 5 sccm to vaporize the CHS in the tank (CHS flow rate of 0.07 sccm). Also, 45 sccm of inert gas (argon gas) (hereinafter referred to as Ar for dilution) introduced from the cylinder 18b for filling the inert gas (argon gas) as a medium for diluting the cyclic hydrogenated silane was supplied to the chamber 1 through the line 11 for supplying the cyclic hydrogenated silane (the tip of the cyclic hydrogenated silane supply nozzle was heated to 200° C. using a heater 6 for the cyclic hydrogenated silane supply nozzle).

Similarly, under irradiation conditions of ultraviolet light with wavelengths of 150 nm to 220 nm (central wavelength of 172 nm) from a xenon excimer lamp as an ultraviolet light generator 10, the nitride (ammonia) gas with a flow rate of 500 sccm was introduced through the line 12 for supplying the nitride (ammonia) from the cylinder 17 for filling the nitride. The nitride (ammonia) gas excited by the ultraviolet light was introduced into the chamber 1 and contacted with the CHS gas to form a silicon nitride film for 30 minutes on the substrate (wafer) 5.

After 30 minutes, the supplies of the CHS gas and the ammonia gas were stopped, and the wafer in which the silicon nitride film was deposited was removed from the wafer loading/unloading chamber 2.

3. Silicon Nitride Film Analysis

The thickness and the refractive index of the nitride silicon film were measured using a spectroscopic ellipsometry system (Horiba Corporation) on a wafer that had been deposited for 30 minutes. A silicon nitride film had a thickness of 35 nm (the average of three measurements) and a refractive index of 2.22 (the average of three measurements). The results are shown in Table 1.

Example 2

Example 2 was carried out in the same manner as Example 1 except that the flow rate of ammonia was changed to 700 sccm, the flow rate of CHS—Ar was changed to 3 sccm (CHS flow rate 0.04 sccm), the flow rate of Ar for dilution was changed to 47 scam, and the film was deposited for 30 minutes as shown in Table 1. As a result of the film analysis, a silicon nitride film had a thickness of 66 nm (the average of three measurements) and a refractive index of 2.08 (the average of three measurements). The results are shown in Table 1.

Example 3

Example 3 was carried out in the same manner as Example 1 except that the flow rate of ammonia was changed to 700 scan, the flow rate of CHS—Ar was changed to 3 sccm (CHS flow rate 0.04 scan), the flow rate of Ar for dilution was changed to 195 scan, and the film was deposited for 30 minutes as shown in Table 1. As a result of the film analysis, a silicon nitride film had a thickness of 51 nm (the average of three measurements) and a refractive index of 2.02 (the average of three measurements). The results are shown in Table 1.

Example 4

Example 4 was carried out in the same manner as Example 1 except that the flow rate of ammonia was changed to 700 sccm, the flow rate of CHS—Ar was changed to 3 sccm (CHS flow rate of 0.02 sccm), the flow rate of Ar for dilution was changed to 195 sccm, the pressure of the tank for filling the CHS was changed to 13.3 kPa, and the film was deposited for 30 minutes as shown in Table 1. As a result of the film analysis, a silicon nitride film had a thickness of 36 nm (the average of three measurements) and a refractive index of 1.95 (the average of three measurements). The results are shown in Table 1.

Example 5

Example 5 was carried out in the same manner as Example 1 except that the substrate temperature was changed to 100° C. and the film was deposited for 30 minutes as shown in Table 2. As a result of the film analysis, a silicon nitride film had a thickness of 76 nm (average of two measurements) and a refractive index of 2.18 (average of two measurements). The results are shown in Table 2.

Example 6

Example 6 was carried out in the same manner as Example 1 except that the substrate temperature was changed to 100° C., the flow rate of Ar for dilution was changed to 20 scan, and the film was deposited for 30 minutes as shown in Table 2. As a result of the film analysis, a silicon nitride film had a thickness of 75 nm (average of two measurements) and a refractive index of 2.09 (average of two measurements). The results are shown in Table 2.

Example 7

Example 7 was carried out under the following conditions: substrate temperature of 450° C., chamber pressure of 400 Pa, ammonia flow rate of 1000 scan, CHS—Ar flow rate of 50 scan (CHS flow rate of 0.7 scan), flow rate of Ar for dilution of 5 scan, and deposition of 60 minutes, as described in Table 3. A silicon nitride film had a thickness of 92 nm. The results are shown in Table 3.

Example 8

Example 8 was carried out under the following conditions: substrate temperature of 350° C., chamber pressure of 400 Pa, ammonia flow rate of 750 sccm, CHS—Ar flow rate of 5 sccm (CHS flow rate of 0.07 sccm), flow rate of Ar for dilution of 145 scan, the pressure of the tank for filling the CHS of 5 kPa, and the distance from the wafer to the tip of the cyclic hydrogenated silane supply nozzle of 35 mm, and the deposition for 30 minutes. A nitride silicon film had a thickness of 50 m.

Then, the obtained silicon nitride film was immersed in 0.5% hydrofluoric acid solution (DHF) for one minute and the etching was evaluated (after immersed in DHF solution for one minute, the film thickness was measured. This evaluation was carried out three times in total). As a result, the etching rate was 5 to 10 nm/min.

Example 9

Example 9 was carried out under the following conditions: substrate temperature of 350° C., chamber pressure of 400 Pa, ammonia flow rate of 500 scan, CHS—Ar flow rate of 3 scam (CHS flow rate of 0.02 scam), flow rate of Ar for dilution of 197 sccm, the pressure of the tank for filling the CHS of 13.3 kPa, and the distance from the wafer to the tip of the cyclic hydrogenated silane supply nozzle of 66 mm, and the deposition for 90 minutes. A silicon nitride film had a thickness of 90 nm at the center of the wafer and a refractive index of 1.94.

Then, the obtained silicon nitride film was subjected to ion sputtering and etching on the surface using X-ray photoelectron spectroscopy (XPS), and elemental ratios of oxygen atoms, carbon atoms, nitrogen atoms, and silicon atoms were measured. N/Si ratio was 1.26 as shown in Table 2. In addition, no carbon or oxygen atoms were detected in the silicon nitride film.

Figure 2:
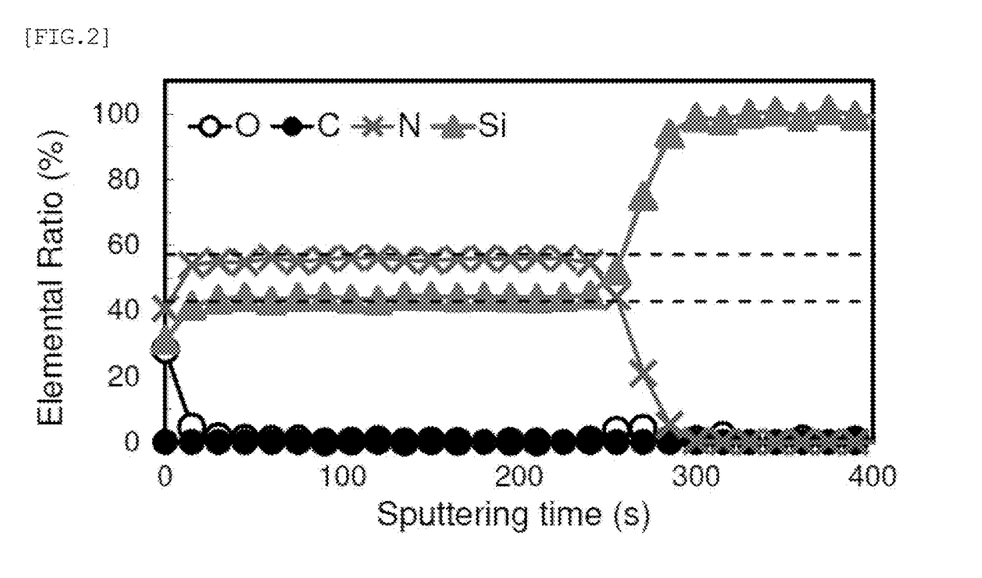
FIG. 2 shows the relationship between elemental ratios (%) of oxygen atoms, carbon atoms, nitrogen atoms, and silicon atoms (vertical axis) and sputtering time (second) (horizontal axis) when a silicon nitride film is subjected to ion sputtering and etching on the surface by XPS (X-ray photoelectron spectroscopy) in at least one embodiment of the present disclosure.

In FIG. 2, the vertical axis and the horizontal axis indicate the elemental ratios (%) of each atoms and the sputtering time (seconds), respectively.

Comparative Example 1

Comparison Example 1 was carried out in the same manner as Example 1, except that ammonia was not irradiated with the ultraviolet light. As a result, a silicon nitride film could not be deposited.

Comparative Example 2

Comparative Example 2 was carried out in the same manner as Example 1 except that disilane ($Si_2H_6$) was used instead of the cyclic hydrogenated silane ($Si_6H_2$), and the heating temperature of the substrate was set at 450° C., the flow rate of $Si_2H_6$ was 5 sccm, the flow rate of ammonia was 1000 sccm, and the flow rate of Ar for dilution was 50 sccm. Table 3 shows some conditions that differ from those in Example 1. A silicon nitride film was formed by increasing the flow rate of disilane ($Si_2HE$) more than that of the cyclic hydrogenated silane ($Si_6H_{12}CHS$), but the film thickness was thinner than that of the cyclic hydrogenated silane, and the deposition rate was slower. The results are shown in Table 3.

TABLE 1

| | Example 1 | Example 2 | Example 3 | Example 4 |
|---|---|---|---|---|
| Irradiation of ultraviolet light | Presence | Presence | Presence | Presence |
| Time of deposition (min) | 30 | 30 | 30 | 30 |
| Substrate temperature (° C.) | 350 | 350 | 350 | 350 |
| Pressure of chamber (Pa) | 400 | 400 | 400 | 400 |
| Pressure of tank for filling CHS (kPa) | 5 | 5 | 5 | 13.3 |
| Flow rate of ammonia (sccm) | 500 | 700 | 700 | 700 |
| Flow rate of CHS-Ar (sccm) | 5 | 3 | 3 | 3 |

TABLE 1-continued

|  | Example 1 | Example 2 | Example 3 | Example 4 |
|---|---|---|---|---|
| Flow rate of CHS (sccm) | 0.07 | 0.04 | 0.04 | 0.02 |
| Flow rate of Ar for dilution (sccm) | 45 | 47 | 195 | 195 |
| Thickness (nm) *) | 35 | 66 | 51 | 36 |
| Refractive index *) | 2.22 | 2.08 | 2.02 | 1.95 |

*) Each of thickness and refractive index was an average value of three points including one point of center part of wafer and two points of about 1 cm away from the center.

TABLE 2

|  | Example 5 | Example 6 |
|---|---|---|
| Irradiation of ultraviolet light | Presence | Presence |
| Time of deposition (min) | 30 | 30 |
| Substrate temperature (° C.) | 100 | 100 |
| Pressure of chamber (Pa) | 400 | 400 |
| Pressure of tank for filling CHS (kPa) | 5 | 5 |
| Flow rate of ammonia (sccm) | 500 | 500 |
| Flow rate of CHS-Ar (sccm) | 5 | 5 |
| Flow rate of CHS (sccm) | 0.07 | 0.07 |
| Flow rate of Ar for dilution (sccm) | 45 | 20 |
| Thickness (nm) *) | 76 | 75 |
| Refractive index *) | 2.18 | 2.09 |

*) Each of thickness and refractive index was an average value of two points including one point of center part of wafer and one point of about 1 cm away from the center.

TABLE 3

|  | Example 7 | Comparative Example 2 |
|---|---|---|
| Irradiation of ultraviolet light | Presence | Presence |
| Silicon gas | $Si_6H_{12}$ | $Si_2H_6$ |
| Time of deposition (min) | 60 | 60 |
| Substrate temperature (° C.) | 450 | 450 |
| Chamber pressure (Pa) | 400 | 400 |
| Pressure of tank for filling CHS (kPa) | 5 | — |
| Flow rate of ammonia (sccm) | 1000 | 1000 |
| Flow rate of CHS-Ar (sccm) | 50 | — |
| Flow rate of CHS (sccm) | 0.7 | — |
| Flow rate of $Si_2H_6$ (sccm) | — | 5 |
| Flow rate of Ar for dilution (sccm) | 5 | 50 |
| Thickness (nm) | 92 | 30 |

According to the above results, a silicon nitride film with a desired film thickness and refractive index could be prepared by contacting the UV-irradiated nitride (ammonia) and the cyclic hydrogenated silane (CHS) on a substrate with a substrate temperature of 100° C. to 450° C. The supply amounts of the cyclic hydrogenated silane (CHS) and the nitride (ammonia) could be adjusted by changing the pressure of the tank for filling the cyclic hydrogenated silane (CHS), the flow rate of the nitride (ammonia) and the flow rate of the media for diluting the cyclic hydrogenated silane (Ar for dilution).

On the other hand, the silicon nitride film could not be deposited in the absence of ultraviolet light irradiation of the nitride (ammonia).

When the disilane of the linear hydrogenated silane was supplied at the substrate temperature of 450° C. and the disilane flow rate was higher than the CHS flow rate, the silicon nitride film could be deposited, but the deposition rate became slower.

DESCRIPTION OF THE REFERENCE NUMERALS

1: Non-plasma reactor (chamber)
2: Chamber before loading and unloading substrate (wafer)
3: Stage
4: Substrate (wafer) heater
5: Substrate (wafer)
6: Heater for cyclic hydrogenated silane supply nozzle
7: Turbomolecular pump
8: Automatic pressure controller
9: Spectrometer
10: Ultraviolet light generator
11: Line for supplying cyclic hydrogenated silane
12: Line for supplying nitride
13: Automatic pressure controller
14*a*, *b*, *c*: Gas flow controller (FCS)
15: Mass flowmeter
16: Tank for filling cyclic hydrogenated silane
17: Cylinder for filling nitride
18*a*, *b*: Cylinder for filling inert gas
19: Cylinder for filling disilane ($Si_2H_6$)

The invention claimed is:

1. A method for preparing a silicon nitride film comprising steps of:
    irradiating a nitride with an ultraviolet light, and
    contacting the nitride irradiated with the ultraviolet light with a cyclic hydrogenated silane represented by a general formula $Si_nH_{2n}$, wherein n is 5, 6, or 7,
    wherein the cyclic hydrogenated silane has a cyclic structure consisting of Si atoms.

2. The method according to claim 1, wherein the nitride irradiated with the ultraviolet light is contacted with the cyclic hydrogenated silane represented by the general formula $Si_nH_{2n}$ on a substrate at 500° C. or lower in a non-plasma reactor.

3. The method according to claim 1, wherein the cyclic hydrogenated silane comprises at least cyclohexasilane.

4. The method according to claim 1, wherein a content of cyclohexasilane is 80% by mass or more per 100% by mass of the cyclic hydrogenated silane.

5. The method according to claim 1, wherein the nitride is ammonia.

6. The method according to claim 1, wherein the ultraviolet light has a wavelength of 100 nm to 250 nm.

7. The method according to claim 2, wherein a temperature of the substrate is 80° C. or higher and 500° C. or lower.

8. The method according to claim 2, wherein the cyclic hydrogenated silane is vaporized by bubbling an inert gas and a vaporized cyclic hydrogenated silane is supplied to the non-plasma reactor.

9. A method for preparing a silicon nitride film comprising steps of:
    irradiating a nitride with an ultraviolet light, and contacting the nitride irradiated with the ultraviolet light with a cyclic silane represented by a general formula $Si_nH_{(2n-a)}R_a$, wherein n is 5, 6, or 7, a is 1 to 2n, R is an alkyl group, an aryl group, $NR'_2$, F, Cl, Br, or I, and R' is H, an alkyl group, or an aryl group, wherein the cyclic silane has a cyclic structure consisting of Si atoms.

10. The method according to claim 2, wherein the cyclic hydrogenated silane comprises at least cyclohexasilane.

11. The method according to claim 2, wherein a content of cyclohexasilane is 80% by mass or more per 100% by mass of the cyclic hydrogenated silane.

12. The method according to claim 3, wherein a content of cyclohexasilane is 80% by mass or more per 100% by mass of the cyclic hydrogenated silane.

13. The method according to claim 2, wherein the nitride is ammonia.

14. The method according to claim 3, wherein the nitride is ammonia.

15. The method according to claim 4, wherein the nitride is ammonia.

16. The method according to claim 2, wherein the ultraviolet light has a wavelength of 100 nm to 250 nm.

17. The method according to claim 3, wherein the ultraviolet light has a wavelength of 100 nm to 250 nm.

18. The method according to claim 3, wherein a temperature of the substrate is 80° C. or higher and 500° C. or lower.

19. The method according to claim 3, wherein the cyclic hydrogenated silane is vaporized by bubbling an inert gas and a vaporized cyclic hydrogenated silane is supplied to the non-plasma reactor.

20. The method according to claim 1, wherein the nitride is a gas containing the nitride and the cyclic hydrogenated silane is a gas containing the cyclic hydrogenated silane.

* * * * *

UNITED STATES PATENT AND TRADEMARK OFFICE
CERTIFICATE OF CORRECTION

| | |
|---|---|
| PATENT NO. | : 11,495,452 B2 |
| APPLICATION NO. | : 16/807717 |
| DATED | : November 8, 2022 |
| INVENTOR(S) | : Akinobu Teramoto |

Page 1 of 1

It is certified that error appears in the above-identified patent and that said Letters Patent is hereby corrected as shown below:

On the Title Page

Item [73], "TOHKU UNIVERSITY" should read -- TOHOKU UNIVERSITY --.

Signed and Sealed this
Fourteenth Day of February, 2023

Katherine Kelly Vidal
*Director of the United States Patent and Trademark Office*